(12) United States Patent
Miki

(10) Patent No.: US 10,790,425 B2
(45) Date of Patent: Sep. 29, 2020

(54) PACKAGE AND METHOD OF MANUFACTURING THE SAME, AND LIGHT EMITTING DEVICE USING THE PACKAGE

(71) Applicant: NICHIA CORPORATION, Anan-shi (JP)

(72) Inventor: Tomohide Miki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 148 days.

(21) Appl. No.: 15/140,792

(22) Filed: Apr. 28, 2016

(65) Prior Publication Data
US 2016/0322552 A1 Nov. 3, 2016

(30) Foreign Application Priority Data

Apr. 30, 2015 (JP) ................................ 2015-093225

(51) Int. Cl.
*H01L 21/00* (2006.01)
*H01L 33/62* (2010.01)
(Continued)

(52) U.S. Cl.
CPC ........ *H01L 33/62* (2013.01); *H01L 23/49548* (2013.01); *H01L 33/483* (2013.01);
(Continued)

(58) Field of Classification Search
CPC ....... H01L 33/62; H01L 33/507; H01L 33/54; H01L 33/60; H01L 33/56; H01L 21/4846;
(Continued)

(56) References Cited

U.S. PATENT DOCUMENTS

| 8,759,866 B2 * | 6/2014 | Kashiwao | ............... H01L 33/60 257/99 |
| 2005/0110123 A1 * | 5/2005 | Waitl | .................... H01L 33/486 257/678 |

(Continued)

FOREIGN PATENT DOCUMENTS

| CN | 102683552 | 9/2012 |
| EP | 2082858 | 7/2009 |

(Continued)

OTHER PUBLICATIONS

Japanese Office Action for corresponding JP Application No. 2015-093225, Feb. 21, 2017 (w/ English machine translation).

(Continued)

*Primary Examiner* — Amar Movva
(74) *Attorney, Agent, or Firm* — Mori & Ward, LLP

(57) ABSTRACT

A package includes a first lead electrode, a second lead electrode, and a resin molded body. The first lead electrode has a first upper surface and a first lower surface defining a depression and opposite to the first upper surface. The second lead electrode has a second upper surface and a second lower surface opposite to the second upper surface. The resin molded body defining a recess with a bottom surface including the first upper surface and the second upper surface, the resin molded body also covering the first lower surface and the second lower surface. The first electrode having a first region closer to the second lead electrode and a second region farther to the second lead electrode than the first region, and having a thickness smaller than a thickness of the first region due to the depression defined in the first lower surface.

23 Claims, 5 Drawing Sheets

(51) Int. Cl.
*H01L 33/54* (2010.01)
*H01L 23/495* (2006.01)
*H01L 33/48* (2010.01)

(52) U.S. Cl.
CPC .... *H01L 33/54* (2013.01); *H01L 2224/48091* (2013.01); *H01L 2224/48247* (2013.01)

(58) Field of Classification Search
CPC ............ H01L 21/565; H01L 23/49838; H01L 23/49894; H01L 23/495–23/49596; H01L 23/49861; H01L 21/4821–21/4842; H01L 23/12–23/15; H01L 25/04–25/13; H01L 33/00–33/648; H01L 2933/005; H01L 2933/0033
USPC .................................................. 438/26, 27, 28
See application file for complete search history.

(56) References Cited

U.S. PATENT DOCUMENTS

| | | | |
|---|---|---|---|
| 2005/0151149 A1 | 7/2005 | Chia et al. | |
| 2005/0277216 A1* | 12/2005 | Asakawa | H01L 31/0203 438/22 |
| 2007/0108436 A1 | 5/2007 | Sanmyo | |
| 2008/0012036 A1 | 1/2008 | Loh et al. | |
| 2008/0054287 A1* | 3/2008 | Oshio | H01L 33/60 257/99 |
| 2010/0102345 A1* | 4/2010 | Kong | H01L 33/486 257/98 |
| 2010/0133560 A1* | 6/2010 | Kim | H01L 33/486 257/89 |
| 2010/0270571 A1* | 10/2010 | Seo | H01L 33/486 257/98 |
| 2012/0262925 A1 | 10/2012 | Lu | |
| 2012/0313131 A1* | 12/2012 | Oda | H01L 23/49503 257/98 |
| 2013/0062632 A1* | 3/2013 | Lee | H01L 25/0753 257/88 |
| 2013/0134468 A1 | 5/2013 | Fukushima et al. | |
| 2013/0187188 A1 | 7/2013 | Sasaoka et al. | |
| 2013/0264604 A1 | 10/2013 | Hayashi | |
| 2014/0071700 A1* | 3/2014 | Yoon | F21V 21/00 362/382 |
| 2015/0138778 A1 | 5/2015 | Oyama | |

FOREIGN PATENT DOCUMENTS

| | | |
|---|---|---|
| JP | 06-312433 | 11/1994 |
| JP | 2003-110145 | 4/2003 |
| JP | 2003-266439 | 9/2003 |
| JP | 2006-032703 | 2/2006 |
| JP | 2007-142044 | 6/2007 |
| JP | 2008-060344 | 3/2008 |
| JP | 2008-182242 | 8/2008 |
| JP | 2009-177093 | 8/2009 |
| JP | 2010-258394 | 11/2010 |
| JP | 2011-192936 | 9/2011 |
| JP | 2012-214021 | 11/2012 |
| JP | 2013-004905 | 1/2013 |
| JP | 2013-004909 | 1/2013 |
| JP | 2013-051296 | 3/2013 |
| JP | 2013-080822 | 5/2013 |
| JP | 2013-149866 | 8/2013 |
| JP | 2013-153144 | 8/2013 |
| JP | 2013-232635 | 11/2013 |
| JP | 2014-029995 | 2/2014 |
| JP | 2014-123672 | 7/2014 |
| JP | 2014-146763 | 8/2014 |
| JP | 2014-207304 | 10/2014 |
| JP | 2016-111169 | 6/2016 |
| KR | 10-2013-0038064 | 4/2013 |
| KR | 10-2013-0098461 | 9/2013 |
| WO | WO 2012/169147 | 12/2012 |

OTHER PUBLICATIONS

Japanese Office Action for corresponding JP Application No. 2015-093225, Jun. 6, 2017 (w/ machine translation).

* cited by examiner

PACKAGE AND METHOD OF MANUFACTURING THE SAME, AND LIGHT EMITTING DEVICE USING THE PACKAGE

CROSS-REFERENCE TO RELATED APPLICATION

The present application claims priority under 35 U. S. C. § 119 to Japanese Patent Application No. 2015-093225, filed Apr. 30, 2015. The contents of this application are incorporated herein by reference in their entirety.

BACKGROUND

1. Technical Field

The present disclosure relates to a package and a method of manufacturing the same, and to a light emitting device using the package.

2. Discussion of the Background

In recent years, the use of light emitting diodes (hereafter may also be referred to as "LEDs") having lower power consumption has been advancing in general lighting applications in place of conventional incandescent or other types of lamps, with expanding fields of applications such as backlights, lightings and in-vehicle use.

Such an LED includes, for example, an LED element mounted in a recess of a package. Such a package may include positive and negative electrodes integrally molded with a resin material (See Japanese Unexamined Patent Application Publication No. 2013-80822 for example).

However, at the time of forming a package, resin burrs may occur due to the viscosity of the resin material, forming method, or the like, which may cause a failure of mounting an LED element.

SUMMARY OF THE INVENTION

The present invention is devised in the light of such circumstances, and it is hence an object thereof to provide a package with fewer burrs and a method of manufacturing the package to reduce the occurrence of the burrs, and a light emitting device using the package.

A package according to certain embodiments of the present invention can include a first lead electrode having a first upper surface and a first lower surface defining a depression and opposite to the first upper surface, a second lead electrode having a second upper surface and a second lower surface opposite to the second upper surface, and a resin molded body defining a recess with a bottom surface including the first upper surface and the second upper surface, the resin molded body also covering the first lower surface and the second lower surface. The first lead electrode include a first region closer to the second lead electrode and a second region farther to the second lead electrode than the first region. The second region has a thickness smaller than that of the first region due to the depression defined in the first lower surface. The resin molded body has a gate mark at a position under the depression.

A light emitting device according to certain embodiments of the present invention can include a package according to certain embodiments of the present invention and a light emitting element mounted on the first upper surface of the package.

A method of manufacturing a package according to certain embodiments of the present invention is a method of manufacturing a package that includes a first lead electrode having a first upper surface and a first lower surface defining a depression and opposite to the first upper surface, a second lead electrode having a second upper surface and a second lower surface opposite to the second upper surface, and a resin molded body defining a recess with a bottom surface including the first upper surface and the second upper surface, the resin molded body also covering the first lower surface and the second lower surface. The method can include providing a second lead electrode and a first lead electrode, the first electrode having a first region closer to the second lead electrode and a second region farther to the second lead electrode than the first region, and having a thickness smaller than that of the first region due to a depression defined in the first lower surface, and in a mold for injection molding having an upper mold and a lower mold that are joined to define a mold cavity, placing the first lead electrode and the second electrode so that the first upper surface and the second upper surface are in contact with the upper mold, injecting a resin material for forming the resin molded body into the cavity from a lower side of the lower mold, and curing or hardening the resin material to form the resin molded body.

According to the configuration described above, at the time of forming the resin molded body, the resin material injected in the molds is received in the depression of the second region that is made by reducing the thickness of a portion of the first lead electrode. The receiving of the resin in the depression increases an upward pressure that presses the first lead electrode to the upper mold, and thus occurrence of resin burrs can be reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
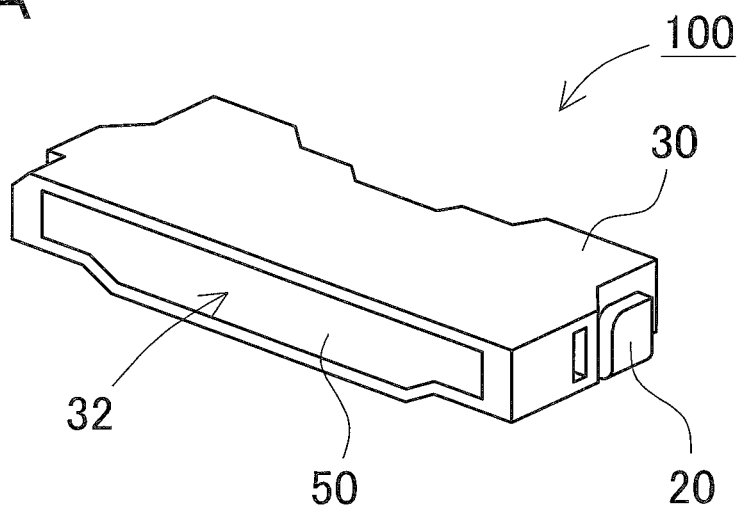
FIG. 1A is a schematic perspective view seen obliquely from above a light emitting device according to a first embodiment of the present invention.

The embodiments according to the present invention will be described below with reference to the drawings. The embodiments are intended as illustrative to give a concrete form to technical ideas of the present invention, and the scope of the invention is not limited to those described below. Further, the members shown in claims attached hereto are not specifically limited to members in the embodiments. The sizes, materials, shapes and the relative configuration etc. of the members described in embodiments are given as an example and not as a limitation to the scope of the invention unless specifically described otherwise. The sizes and the arrangement relationships of the members in each of drawings are occasionally shown exaggerated for ease of explanation. In the description below, the same designations or the same reference numerals denote the same or like members and duplicative descriptions will be appropriately omitted. In addition, a plurality of structural elements of the present invention may be configured as a single part which serves the purpose of a plurality of elements, and vice versa, a single structural element may be configured as a plurality of parts which serve the purpose of a single element. Description given in one example and one embodiment can also be applied in other examples and embodiments. Further, in the specification, the term "on", such as used in "on the layer" etc. includes not only a case where a component is in contact with the layer, but also a case where a component is above the layer, and also includes a case where an intermediate layer presents between layers.

First Embodiment

Figure 1B:
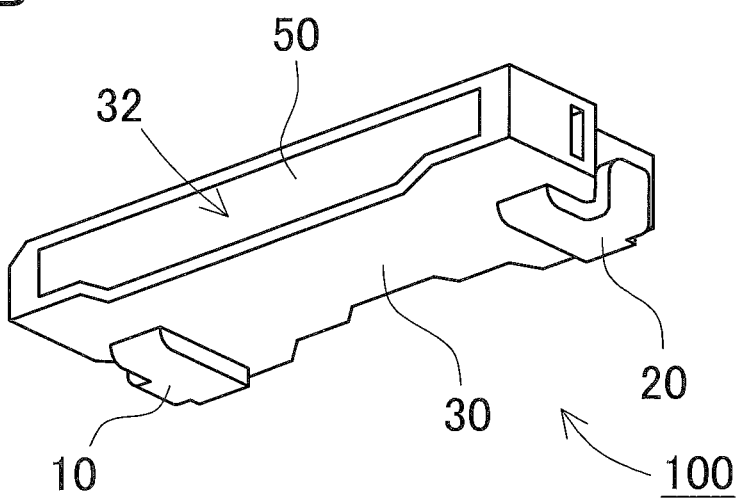
FIG. 1B is a schematic perspective view seen obliquely from below of the light emitting device.
Figure 1C:
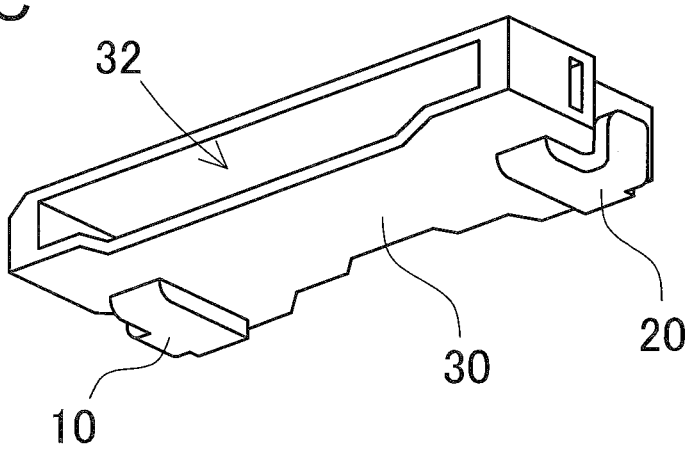
FIG. 1C is a schematic perspective view seen obliquely from below a package according to the first embodiment of the present invention.
Figure 2:
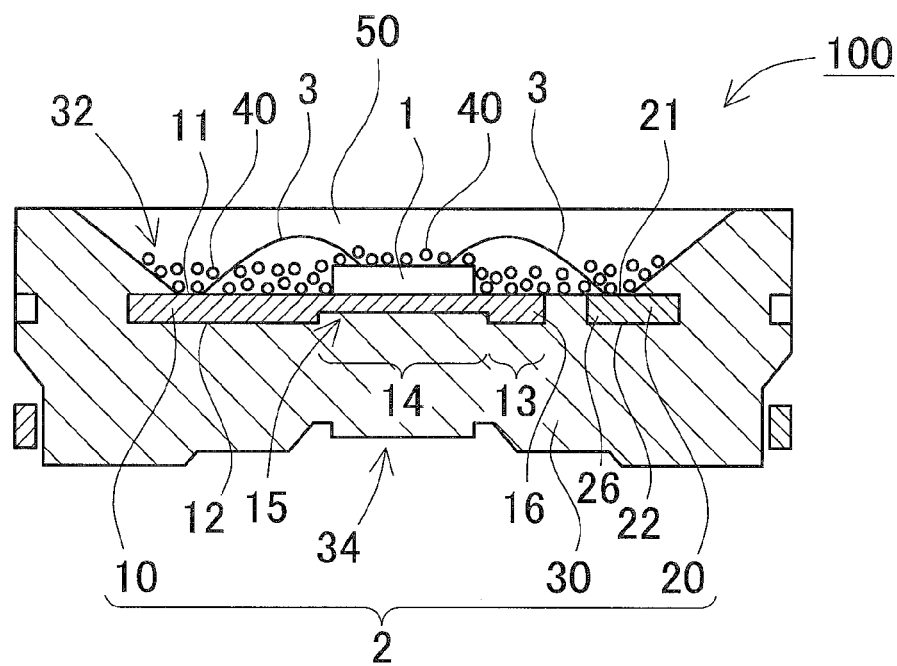
FIG. 2 is a schematic cross-sectional view of the light emitting device in FIGS. 1A to 1C.

A light emitting device 100 according to a first embodiment of the present invention will be described. FIG. 1A is a schematic perspective view seen obliquely from above the light emitting device 100, FIG. 1B is a schematic perspective view seen obliquely from below of the light emitting device 100, and FIG. 2 is a schematic cross-sectional view of the light emitting device 100. The light emitting device 100 shown in these figures includes a light emitting element 1 and a package 2 in which the light emitting element 1 is mounted. The package 2 includes a first lead electrode 10, a second lead electrode 20, and a resin molded body 30. The package 2 according to the first embodiment 1 is shown in FIG. 1C, viewed from obliquely downward.

Resin Molded Body 30

The resin molded body 30 is a support member configured to hold the first lead electrode 10 and the second lead electrode 20. The resin molded body 30 is made of a resin material. The resin molded body 30 is also formed in a shape of a substantially rectangular thin parallelepiped. In the present specification, the expression a "thin" resin molded body and a "thin" package refers to a shape of a resin molded body or a package with a height dimension smaller than its width and depth dimensions.

The first lead electrode 10 and the second lead electrode 20 are bent along respective lateral surfaces from a bottom surface of the resin molded body 30. The first lead electrode 10 and the second lead electrode 20 serves as a pair of lead electrodes. The resin molded body 30 defines a recess 32 opening at the front side, and the recess 32 provides a light emitting region.

The lateral surfaces defining the recess 32 of the resin molded body 30 preferably form a shape that facilitates emission of the light emitting element 1 mounted on the bottom surface of the recess to a light emitting surface side of the resin molded body 30, and for example, a tapered shape, which gradually widens toward the light emitting surface may be employed.

The light emitting element 1 is of a face-up type with a pair of electrodes on the same side. The positive and negative electrodes of the light emitting element 1 are connected to the first lead electrode 10 and the second lead electrode 20, respectively. First edge portions 16, 26 of the first lead electrode 10 and the second lead electrode 20 are exposed in the recess 32 to electrically and physically connected to the respective electrodes of the light emitting element 1. The second edge portions of the first lead electrode 10 and the second lead electrode 20 are extend to outside from a bottom surface of the resin molded body 30 (i.e., main surface of the mounted surface side of the light emitting device 100) so as to serve as external connection terminals.

The first lead electrode 10 has a first upper surface 11 and a first lower surface 12 opposite to the first upper surface 11. The first upper surface 11 serves as a mounting surface for the light emitting element 1. Meanwhile, the second lead electrode 20 has a second upper surface 21 and a second lower surface 22 opposite to the second upper surface 21. The second upper surface 21 is configured to be electrically connect to the light emitting element 1. The first lead electrode 10 and the second lead electrode 20 are preferably covered by the resin molded body 30 so that the first upper surface 11 and the second upper surface 21 are in the same plane.

Resin Molded Body

The resin molded body 30 partially encloses the first lead electrode 10 and the second lead electrode 20. The resin molded body 30 defines the recess 32 for mounting the light emitting element 1. The first upper surface 11 of the first lead electrode 10 and the second upper surface 21 of the second lead electrode 20 are exposed at the bottom surface of the recess 32. In other words, as shown in the schematic cross-sectional view in FIG. 2, with the first lead electrode 10 and the second lead electrode 20 spaced apart from each other, the first upper surface 11, the second upper surface 21, and an upper surface of the resin molded body 30 therebetween (i.e., between positive and negative electrodes) are arranged to form a coplanar bottom surface of the recess 32. The resin molded body 30 partially encloses the first lead electrode 10 and the second lead electrode 20 so as to cover a first lower surface 12 and a second lower surface 22. Meanwhile, as shown in FIG. 1B, the second edge portions that are respectively opposite ends to the edge portions 16 and 26 of the first lead electrode 10 and the second lead electrode 20 are extended out from a bottom surface of the resin molded body 30.

Lead Electrodes

The first lead electrode 10 and the second lead electrode 20 are made of a metal material having high electrical conductivity, such as Cu or Fe. In particular, an alloy of Cu and Fe is preferable in view of thermal conductivity and mechanical strength. In order to increase light reflectance, surfaces of the lead electrodes are preferably covered by a metal film For example, Ag plating is suitably used for the metal film Further, in view of atomic diffusion and reduction in corrosion, at least a layer of Ni, more preferably a multilayer of Ni—Pd, Ni—Au, or Ni—Pd—Au is preferably formed as an underlayer of Ag plating.

The first lead electrode 10 includes a first region 13 closer to the second lead electrode 20 and a second region 14 farther to the second lead electrode 20 than the first region 13. The second region 14 has a thickness smaller than that of the first region 13. In an example shown in the cross-sectional view in FIG. 2, a depression 15 is formed in the first lower surface 12 of the first lead electrode 10, so that the thickness of the second region 14 is reduced by the depression 15 compared to the thickness of the first region 13. With this configuration, at the time of injection molding the resin molded body 30, the resin material 68 for the resin molded body 30 that is injected in the molds is received by the second region 14 that is made by reducing the thickness of a portion of the first lead electrode 10. The receiving of the resin in the depression increases an upward pressure that presses the first lead electrode to the upper mold, and thus occurrence of resin burrs can be reduced.

In the case of injection molding in which the lead electrodes are not in contact with the upper and lower molds at portions held by the upper and lower molds, in other words, a structure that allows an excessive resin material trapping between the lead electrodes and the upper and lower molds, resin burrs are likely to occur on the upper surfaces of the lead electrodes, especially on a surface to serve as a mounting surface of the light emitting element. The resin burrs especially occur in the case of using a thermosetting resin having a low melt viscosity. For example, if a large amount of resin burrs occur on the bottom surface of the recess, more time and effort are required in removing the resin burrs. A resin-burr removing operation is generally essential, but the larger the area of the resin burrs, the greater the workload. Therefore it is preferable to minimize the occurrence of resin burrs.

Figure 3:
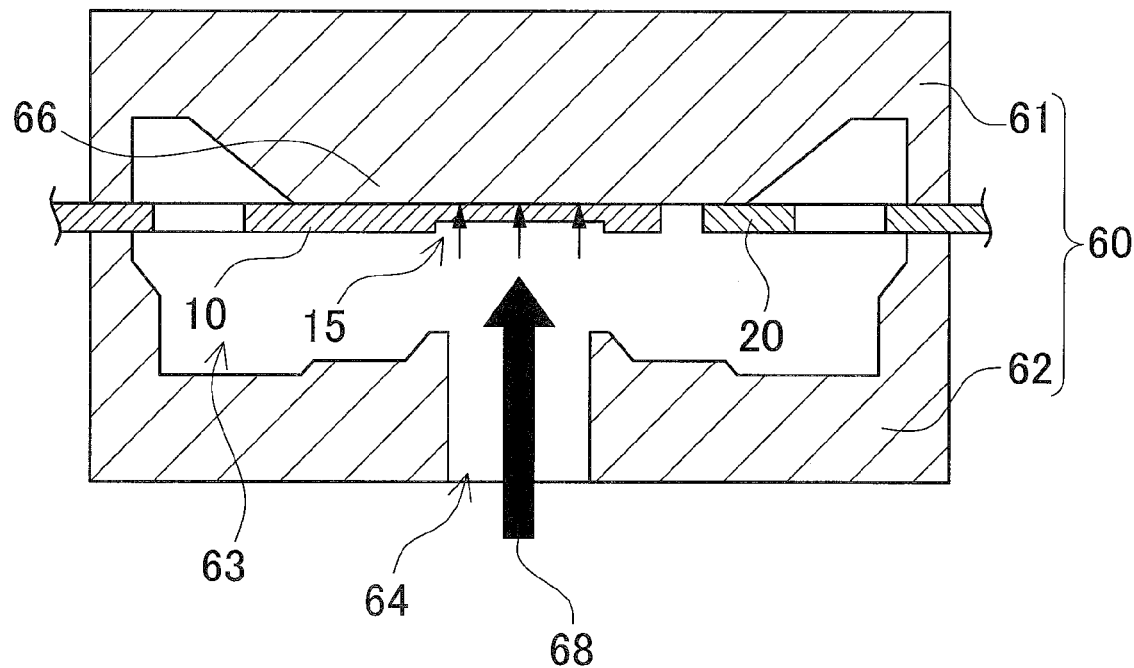
FIG. 3 is a schematic cross-sectional view illustrating forming of a package for the light emitting device of FIG. 2 using molds.

Accordingly, the thickness of the first lead electrode 10 is partially reduced in the lower surface to form the depression 15 to adjust the flow direction of the injected resin material 68, and thus, an upward pressure that presses the first lead electrode 10 to the upper mold 61 is increased. As a result, as shown in the schematic cross-sectional view in FIG. 3, the injected resin material 68 is directed to the depression 15 to increase the pressure therein, pressing the first lead electrode 10 tightly to the upper mold 61, which reduces looseness of the first lead electrode 10, which reduces occurrence of the resin burrs. The depression 15 can be formed by an operation such as etching, pressing, rolling, or cutting (laser cutting, drill cutting, blast cutting, or the like).

Second Embodiment

Figure 4:
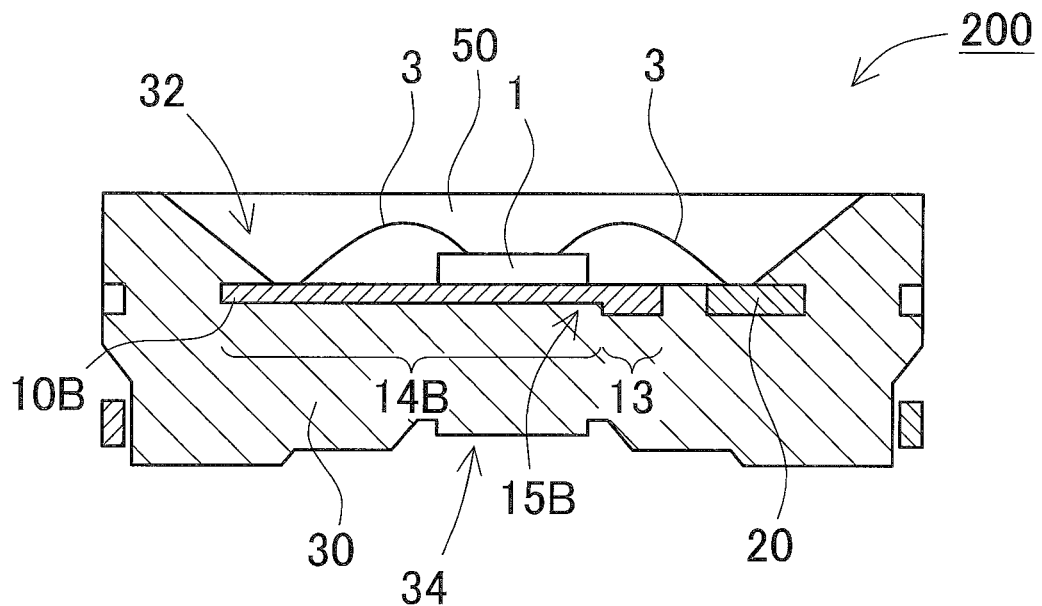
FIG. 4 is a schematic cross-sectional view of a light emitting device according to a second embodiment of the present invention.

In an example shown in FIG. 2, a depression 15 is formed, in a cross-sectional view, spaced apart from both end surfaces of a first lead electrode 10. With this configuration, as shown in the cross-sectional view of FIG. 3, a resin material 68 injected into a mold cavity is easily received in a second region 14, so that flow of the resin material 68 can be controlled. This is especially effective in the case where the depression 15 is formed spaced apart from the both end surfaces of the first lead electrode 10 in any cross-sectional view. The depression 15 is formed in the first lead electrode 10, spaced apart from both end surfaces of the first lead electrode 10 in a lateral direction (that is, in a long-side direction along which the first lead electrode 10 and the second lead electrode 20 are arranged side by side), but the depression 15 may be formed penetrating in a longitudinal direction (a short-side direction, which is a thickness direction or in other words, a height direction of the package). The depression 15 may be formed in an appropriate shape other than that described above. For example, the depression 15 can be formed in a step shape or a stepped shape as in the light emitting device 200 of the second embodiment shown in FIG. 4. In the example shown in FIG. 4, the depression 15B is formed in the second region 14B of the first lead electrode 10B, from which it also can be seen that a protrusion is formed in the first region 13B.

Third Embodiment

Figure 5:
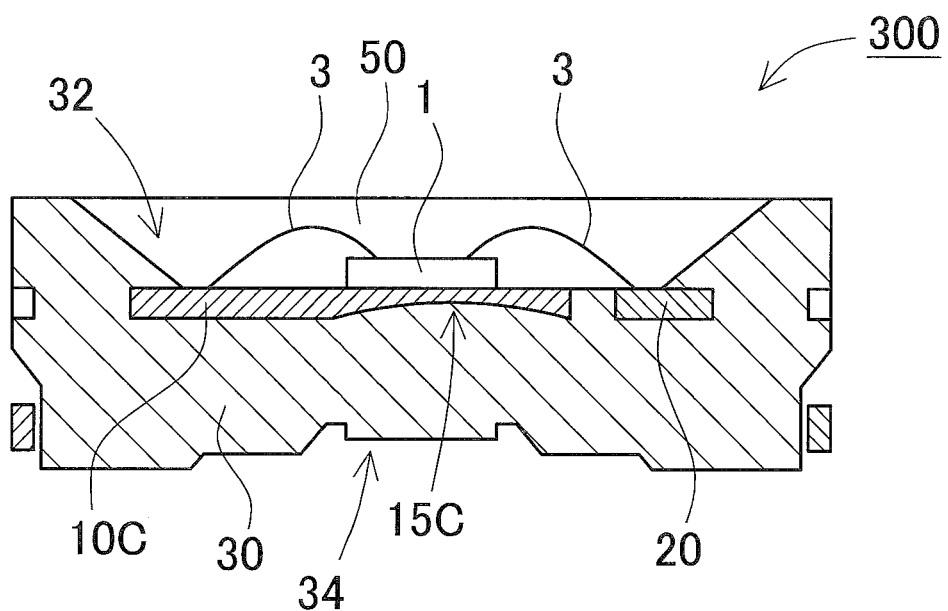
FIG. 5 is a schematic cross-sectional view of a light emitting device according to a third embodiment of the present invention.

Also, the depression 15 can be formed in a curved shape as in the light emitting device 300 according to the third embodiment shown in FIG. 5. Such a first lead electrode 10C has the advantage that it can be easily processed and formed by pressing, rolling, or the like.

As described above, the shape of the depression 15 is defined by the relative configuration of the first region and the second region. In the present specification, the term "depression" refers to a shape that allows a reduction in the flow of the resin material injected in the mold, along the first lower surface 12 at least in one direction. For example, in the first lead electrode, a stepped shape of the boundary between the first region defining the depression and the second region can be formed by cutting or the like. The depression may be defined in a small concave shape, a linear or curved groove shape, a lattice-shaped groove, or the like, other than the shapes described above. Also, one or more protrusions may be formed in the depression.

Resin Material

As a resin material for a resin molded body 30, for example, a resin material for injection molding can be used. Among such resin materials, a thermosetting resin having good light resistance and heat resistance can be suitably used, as well as a thermoplastic resin. In particular, an unsaturated polyester based resin is preferable. Specific examples of such resin include those described in Japanese Patent Publication Nos. 2013-153144, 2014-207304, and 2014-123672. In the case of injection molding the resin molded body of the package by using a thermosetting resin, due to a low melt viscosity of the thermosetting resin, resin burrs would very likely to occur on the upper surface of the lead electrode in a configuration in which the lead electrodes are not in contact with the upper and lower molds at portions held by the upper and lower molds. Whereas, in a package according to the third embodiment, at the time of injection molding the resin molded body, a resin material injected into the mold is received in the depression 15 provided in the first lower surface 12, so that the first lead electrode is pressed to the upper mold, which can reduce occurrence of resin buns. As the thermoplastic resin, one of those shown below can be suitably used: an aliphatic polyamide resin, a semi-aromatic polyamide resin, an aromatic polyphthalamide resin, a polycyclohexylenedimethylene terephthalate, a polyethylene terephthalate, a polycyclohexylene terephthalate, a liquid crystal polymer, and a polycarbonate resin. As the thermosetting resin, one of those shown below can be suitably used: an epoxy resin, a silicone resin, a polyimide resin, a polyurethane resin, a polybismaleimide triazine resin, an unsaturated polyester resin, a diallyl phthalate resin, and modified versions of these resins.

The light from the light emitting element 1 can be efficiently reflected and extracted to outside by improving the reflectance of the resin molded body 30. For this, the resin molded body is formed with a color of high reflectance such as a white color. For example, it is preferable to mix white pigment such as titanium oxide ($TiO_2$), zinc oxide (ZnO), or the like, in the resin molded body 30. In particular, titanium oxide is preferable for its high opacifying properties. In addition, a reinforcing agent or a filler such as silica, aluminum oxide, glass, potassium titanate, calcium silicate (wallastonite), or the like can be mixed in the resin molded body 30.

The resin molded body 30 preferably has a gate mark 34 under the depression 15. With this configuration, a resin material injected into the mold can be easily received in the depression in the second region and an upward pressure that presses the first lead electrode to the upper mold can be easily increased. As used in the present specification, the term "gate mark" refers to a protrusion formed on the resin molded body 30 as a trace of the gate (a material injection gate 64) that is an inlet port of the resin material injecting into the mold. The package according to the third embodiment includes the gate mark 34 at approximately center of the lower surface (i.e., back surface) of the resin molded body.

Light Emitting Element 1

The light emitting element 1 has a pair of electrodes on the same surface side. The light emitting element 1 is mounted on the first upper surface 11 of the first lead electrode 10 via wires 3 using wire bonding method via wires 3, or the like. Alternatively, the light emitting element 1 can be mounted using a flip-chip (face down) mounting. The light emitting element 1 is a semiconductor element, which configured to emit light upon being applied with an appropriate voltage, and a known semiconductor light emitting element made of nitride semiconductor, or the like, can be employed for the light emitting element 1. The light emitting element of an appropriate wavelength can be selected to obtain a desired light emission color. More specifically, a nitride-based semiconductor represented by the formula: $In_XAl_YGa_{1-X-Y}N$ ($0 \leq X$, $0 \leq Y$, $X+Y \leq 1$) can be used for a light emitting element to emit blue light (wavelength in a range of 430 nm to 490 nm) or green light (wavelength in a range of 490 nm to 570 nm), and an arsenic-based or a phosphorous-based compound semiconductor represented by the formulas: GaAlAs, AlInGaP or the like can be used for a light emitting element to emit red light (wavelength in a range of 620 nm to 750 nm). Further, the light emitting element having a light emission color varied by the mixing ratio can be used. For a growth substrate of the semiconductor element, a substrate of a hexagonal crystal system such as sapphire or GaN can be used.

Single or a plurality of the light emitting elements 1 are housed in a package 2, in which each light emitting element 1 is on the first lead electrode 10 and/or a second lead electrode 20 exposed at a bottom surface of a recess 32 of the package 2. Only one light emitting element 1 can be mounted on the first lead electrode 10, or a plurality of the light emitting elements 1 can be mounted on the first lead electrode 10. Also one or more light emitting elements 1 can be mounted either on the first lead electrode 10 or on the second lead electrode 20, respectively. In the case where one or more of the light emitting element are mounted in a flip-chip manner, the light emitting elements are mounted straddling the first lead electrode and the second lead electrode. In this case, length of the first lead electrode and the second lead electrode can be substantially the same.

For the light emitting element 1, light emitting diodes of various emission wavelengths can be selected. In particular, in order to obtain white light emission, it is preferable to combine a nitride semiconductor light emitting element that emits blue light, and a phosphor that absorbs the blue light and emit yellow, green or red light.

Wavelength Converting Member 40

A wavelength converting member 40 can be included in the light emitting device. In the light emitting device 100 shown in FIG. 2, a light-transmissive resin 50 is filled in the recess 32 to seal the light emitting element 1 mounted in the recess 32. The wavelength converting member 40 is contained in the light-transmissive resin 50. The wavelength converting member 40 is configured to convert light of a first peak wavelength emitted from the light emitting element 1 to a light of a second peak wavelength which is different the first peak wavelength. For the wavelength converting member 40, a phosphor can be suitably used. For the light-transmissive resin 50, silicone resin or modified silicone resin is preferable, of those, methyl-phenyl silicone resin is particularly preferable.

According to the configurations as described above, the light emitting device 100 can emit a mixed-color light of light with the first wavelength emitted from the light emitting element 1 and light with the second wavelength emitted from the wavelength converting member 40. For example, by using a blue LED as the light emitting element and a phosphor such as YAG as the wavelength converting member, blue light emitted from the blue LED and yellow fluorescence emitted from the phosphor. Thus, the light emitting device configured to emit white light can be obtained.

Side-Emission Type Light Emitting Device

In the embodiments discussed above, examples applied to a side-emission type (i.e., side view type) light emitting device have been illustrated. The side-emission type light emitting device includes a package defining a recess 32 in the front surface of the package 2 to house one or more light emitting elements 1. This type of light emitting device includes a package 2 of small thickness, in which resin burrs tend to occur during molding of the resin molded body of the package 2. The present invention can be suitably applied to reduce occurrence of such resin buns. The present invention is applicable even to the light emitting device of very small thickness, for example, a thickness in a range of 0.25 mm to 1.50 mm, preferably in a range of 0.25 mm to 1.00 mm, more preferably in a range of 0.25 mm to 0.60 mm Further, the present invention is also applicable to a larger device such as a top-emission type (i.e., top-view type) light emitting device, in addition to a device of small thickness such as a side-emission type light emitting device.

Method of Manufacturing Light Emitting Device

Next, a method of manufacturing the light emitting device will be described. First, the first lead electrode 10 defining the recess 15 and the second lead electrode 20 are provided. Next, the first lead electrode 10 and the second lead electrode 20 are set in an injection molding mold. At this time, the first electrode 10 and the second lead electrode 20 are set so that the first upper surface 11 and the second upper surface 12 are in contact with the upper mold 61. In this state, a resin material 68 is injected into the mold from a lower side of the lower mold, and is cured or hardened to form the resin molded body 30. Now, with reference to the cross-sectional views in FIG. 6A to FIG. 6D and the plan view of FIG. 7, the method will be described in detail below.

The first lead electrodes 10 and the second lead electrodes 20 are formed in a sheet shape of a leadframe sheet that is formed by stamping a metal plate. The leadframe sheet is formed by, for example, stamping a metal plate and applying Ag plating. The leadframe has the first lead electrode 10 and the second lead electrode 20 to serve as a pair of lead electrodes, and edge portions 16 and 26 of the first lead electrode 10 and the second lead electrode 20 face each other with a gap therebetween. Generally, a plurality of the first lead electrodes 10 and the second lead electrodes 20 are formed on one metal plate.

Figure 6A:
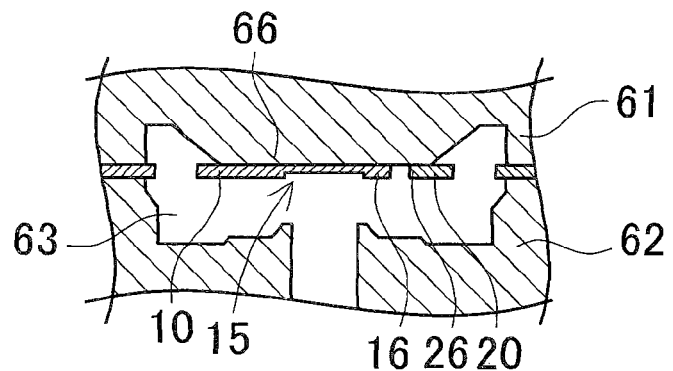
FIGS. 6A to 6D are schematic cross-sectional views illustrating steps of a method of manufacturing a package.

Next, as shown in FIG. 6A, the lead electrodes are placed between the upper mold 61 and a lower mold 62 of a mold 60 for molding the package, and held by the upper mold 61 and the lower mold 62. At this time, the edge portions 16 and 26 of the first lead electrode 10 and the second lead electrode 20 are placed in a cavity 63 defined in a shape corresponding to the resin molded body 30.

Figure 6B:
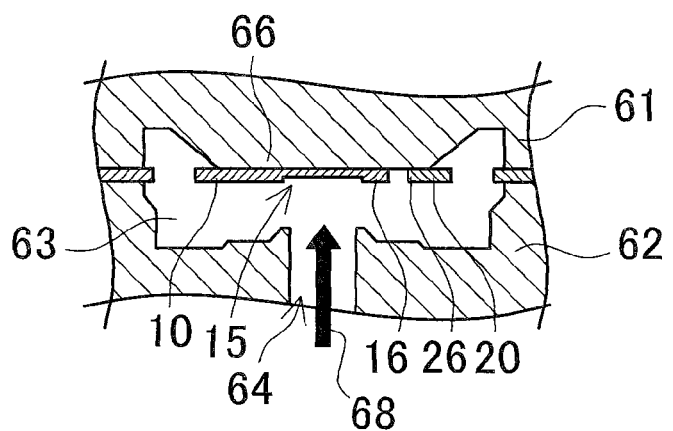

Then, as shown in FIG. 6B, the resin material 68 is injected into the mold cavity 63 of the mold 60 from a material injection gate 64 of the lower mold 62. The upper mold 61 has a protrusion 66 formed corresponding to the recess 32 of the resin molded body 30. In a state where the protrusion 66 is in contact with the upper surfaces of the edge portions 16, 26 of the first lead electrode 10 and the second lead electrode 20 respectively, the resin material 68 is injected in the mold cavity 63. Accordingly, the edge portions 16 and 26 can be exposed on a bottom surface of the recess 32 of the obtained resin molded body 30.

In this example, the entire portions of the upper surfaces of the end portions of the first lead electrode 10 and the second lead electrode 20 are exposed at the bottom surface of the recess 32 of the resin molded body 30, but the exposure of the entire portions is not necessarily needed. That is, the first electrode and the second lead electrode may be partially embedded in the resin molded body at the bottom surface of the recess.

Figure 6C:
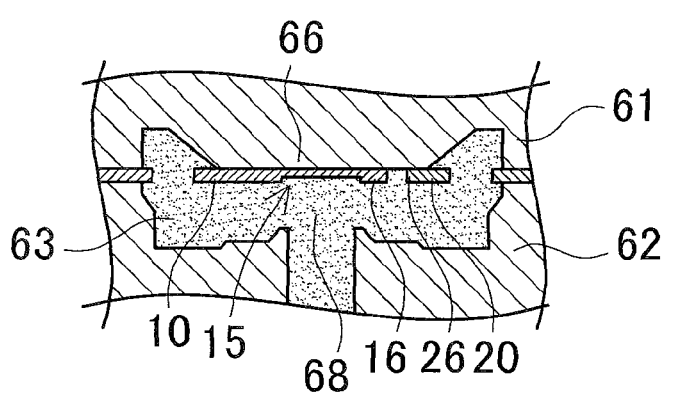
Figure 6D:
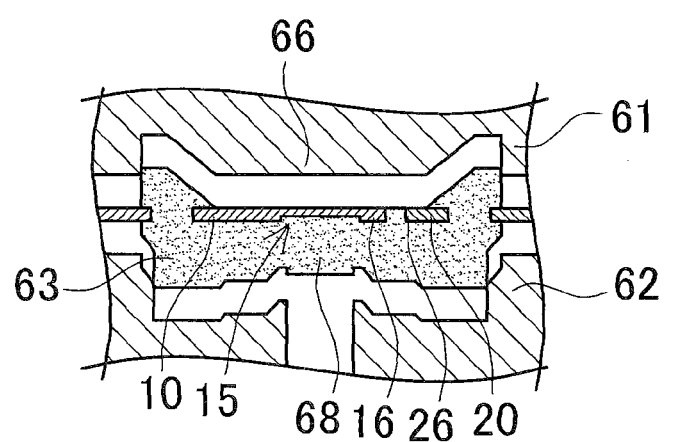

Next, as shown in FIG. 6C, the resin material 68 in the mold 60 is cured or hardened. Then, as shown in FIG. 6D, the lower mold 62 and the upper mold 61 are removed. Accordingly, the resin molded body 30 with few resin burrs can be obtained.

If necessary, such resin burrs may be further removed from the resin molded body 30 obtained as described above. Removing of the resin burrs may be performed on the bottom surface of the recess 32 of the package 2 so that resin burrs are removed at least from the region to mount the light emitting element 1, and in the case of wire bonding, from the region to connect the wire. In other words, removing of the resin burrs from the region to mount and electrically connected to the light emitting element 1 is sufficient, and removing of the resin burrs from other regions is not necessary. Meanwhile, for example, a reduction in the reflectance of the first lead electrode and the second lead electrode may occur due to deterioration over time. Also, meanwhile, in the case of applying Ag plating on the surfaces of the first lead electrode and the second lead electrode, a reduction in the reflectance of the electrodes may occur due to discoloration associated with sulfurization of Ag. Accordingly, with the resin burrs that are intentionally left on the bottom surface of the recess, the relative area of exposed region of the Ag plating can be reduced, which also can reduce the area that may deteriorate in time. Thus, an effect of a reduction in degradation ratio of output power due to deterioration over time can be expected.

The light emitting element 1 is mounted on the package 2 obtained as described above. More specifically, the light emitting element 1 is mounted on the first upper surface 11 of the first lead electrode 10 as a mounting surface. The method of mounting may be such that, the light emitting element is bonded on the first upper surface 11 by using an adhesive material, and then wire bonding is performed and the light emitting element 1 is bonded through the wires 3. Then, the light-transmissive resin 50 is filled in the recess 32 to seal the light emitting element 1.

Figure 7:
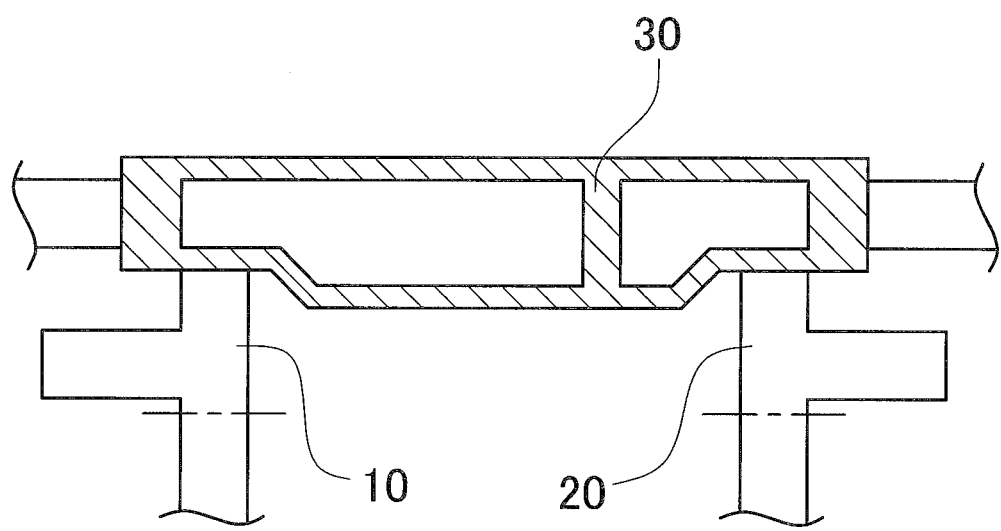
FIG. 7 is a schematic cross-sectional view illustrating cutting of a light emitting device from a leadframe sheet.

As described above, after mounting and sealing the light emitting elements in the respective packages, as shown in FIG. 7, the leadframe sheet is cut to singulate individual light emitting devices.

As described above, the light emitting device and the method of manufacturing the same according to the present invention are applicable to devices that employing light emitting components of very small thickness such as backlight of liquid crystal display, and also as an LED display, applicable to large-sized televisions, billboards, advertising displays, traffic information, three-dimensional display apparatus, lighting fixtures, or the like. Specifically, this light emitting device and the method of manufacturing the same are suitable for downsizing, lowering the cost, automation and improving design freedom of devices. Instead of a light emitting element, the present invention can be suitably applied to a light receiving device, in which a light receiving element is mounted, and suitably used for an optical sensor, or the like. Thus, a light emitting device in the present specification includes a meaning of a light receiving device.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a package that includes a first lead electrode having a flat first upper surface that is an entire upper surface of the first lead electrode in a cutaway and a first lower surface defining a depression and opposite to the first upper surface, a second lead electrode having a second upper surface and a second lower surface opposite to the second upper surface, and a resin molded body defining a recess with a bottom surface including the first upper surface and the second upper surface, the resin molded body also covering the first lower surface and the second lower surface, the method comprising:

providing a second lead electrode and a first lead electrode, the first lead electrode having a first region closer to the second lead electrode and a second region farther to the second lead electrode than the first region, the second region having a thickness smaller than a thickness of the first region due to the depression defined in the first lower surface; and forming the resin molded body by placing the first lead electrode and the second lead electrode in a mold for injection molding having an upper mold and a lower mold that are joined to define a mold cavity so that the first upper surface and the second upper surface are in contact with the upper mold, injecting a resin material for forming the resin molded body into the cavity from a lower side of the lower mold, and curing or hardening the resin material, wherein a gate, which is an inlet to inject the resin material for forming the resin molded body, is located under the depression, wherein an outer periphery of the gate is positioned inner side of a boundary between the first region and the second region, and wherein the depression is formed spaced apart from both end surfaces of the first lead electrode in any cross-sectional view.

2. The method of manufacturing a package according to claim 1, wherein the depression is formed in a curved shape.

3. The method of manufacturing a package according to claim 1, wherein a boundary of the depression which is located between the first region and the second region is formed in a stepped shape.

4. The method of manufacturing a package according to claim 1, wherein a gate, which is an inlet to inject the resin material for forming the resin molded body, is located under the depression.

5. The method of manufacturing a package according to claim 1, wherein the resin material for forming the resin molded body is a thermosetting resin.

6. The method of manufacturing a package according to claim 5, wherein the resin material for forming the resin molded body is an unsaturated polyester based resin.

7. The method of manufacturing a package according to claim 1, wherein the resin molded body contains titanium oxide.

8. The method of manufacturing a package according to claim 1, wherein the package is for a side-emission type light emitting device.

9. The method of manufacturing a package according to claim 8, wherein the package has a thickness in a range of 0.25 mm to 1.50 mm.

10. The method of manufacturing a package according to claim 1,
wherein the second region has a first thickness above the center of the depression, the first thickness being smaller than a second thickness at one of the end surfaces of the first lead electrode in the first region, the end surface facing the second lead electrode, and
wherein the first thickness of the second region extends through the entire thickness of the first lead electrode at the second region.

11. A package comprising:
a first lead electrode having a first upper surface that is an entire upper surface of the first lead electrode in a cutaway and a first lower surface defining a depression and opposite to the first upper surface;
a second lead electrode having a second upper surface and a second lower surface opposite to the second upper surface; and
a resin molded body defining a recess with a bottom surface including the first upper surface and the second upper surface, the resin molded body also covering the first lower surface and the second lower surface,
wherein the first lead electrode including a first region closer to the second lead electrode and a second region farther to the second lead electrode than the first region, the second region having a thickness smaller than a thickness of the first region due to the depression defined in the first lower surface, and the resin molded body having a gate mark at a position under the depression,
wherein the gate mark has an outer periphery positioned inner side of a boundary between the first region and the second region, and
wherein the depression is formed spaced apart from both end surfaces of the first lead electrode in any cross-sectional view.

12. The package according to claim 11, wherein the depression is formed in a curved shape.

13. The package according to claim 11, wherein a boundary of the depression that is located between the first region and the second region is formed in a stepped shape.

14. The package according to claim 11, wherein the resin material for forming the resin molded body is a thermosetting resin.

15. The package according to claim 14, wherein the resin material for forming the resin molded body is an unsaturated polyester based resin.

16. The package according to claim 11, wherein the resin molded body contains titanium oxide.

17. The package according to claim 11, wherein the package is for a side-emission type light emitting device.

18. The package according to claim 17, wherein the package has a thickness in a range of 0.25 mm to 1.50 mm.

19. A light emitting device comprising:
the package according to claim 12, and
the light emitting element mounted on the first upper surface of the first lead electrode.

20. The method of manufacturing a package according to claim 1, wherein the depression has a width longer than an inner diameter of the gate in a cross-sectional view.

21. The package according to claim 11, wherein the depression has a width longer than that of the gate mark in a cross-sectional view.

22. The package according to claim 11,
wherein the second region has a first thickness above the center of the depression, the first thickness being smaller than a second thickness at one of the end surfaces of the first lead electrode in the first region, the end surface facing the second lead electrode, and
wherein the first thickness of the second region extends through the entire thickness of the first lead electrode at the second region.

23. A package comprising:
a first lead electrode having a first upper surface and a first lower surface defining a depression and opposite to the first upper surface;
a second lead electrode having a second upper surface and a second lower surface opposite to the second upper surface; and
a resin molded body defining a recess with a bottom surface including the first upper surface and the second upper surface, the resin molded body also covering the first lower surface and the second lower surface,
wherein the first lead electrode including a first region closer to the second lead electrode and a second region farther to the second lead electrode than the first region, the second region having a thickness smaller than a thickness of the first region due to the depression defined in the first lower surface, and the resin molded body having a gate mark at a position under the depression,
wherein the gate mark has an outer periphery positioned on an inner side of a boundary between the first region and the second region,
wherein the depression is formed spaced apart from both end surfaces of the first lead electrode in any cross-sectional view,
wherein the second region has a first thickness above the center of the depression, the first thickness being smaller than a second thickness at one of the end surfaces of the first lead electrode in the first region, the end surface facing the second lead electrode, and
wherein the first thickness of the second region extends through the entire thickness of the first lead electrode at the second region.

* * * * *